United States Patent
Sakiyama et al.

(10) Patent No.: US 12,403,771 B2
(45) Date of Patent: Sep. 2, 2025

(54) ABNORMALITY DIAGNOSING SYSTEM, AND POWER SUPPLY SYSTEM FOR VEHICLE

(71) Applicant: SANYO Electric Co., Ltd., Osaka (JP)

(72) Inventors: Yoshitaka Sakiyama, Hyogo (JP); Noriharu Kobayashi, Hyogo (JP); Hidetsugu Mukae, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 450 days.

(21) Appl. No.: 17/434,478

(22) PCT Filed: Dec. 19, 2019

(86) PCT No.: PCT/JP2019/049757
§ 371 (c)(1),
(2) Date: Aug. 27, 2021

(87) PCT Pub. No.: WO2020/179192
PCT Pub. Date: Sep. 10, 2020

(65) Prior Publication Data
US 2022/0134886 A1 May 5, 2022

(30) Foreign Application Priority Data
Mar. 6, 2019 (JP) .................. 2019-040507

(51) Int. Cl.
*B60L 3/00* (2019.01)
*G01R 31/3835* (2019.01)
(Continued)

(52) U.S. Cl.
CPC ........ *B60L 3/0046* (2013.01); *G01R 31/3835* (2019.01); *G01R 31/396* (2019.01);
(Continued)

(58) Field of Classification Search
CPC ............ B60L 3/0046; B60L 2240/547; G01R 31/396; G01R 31/3835; H01M 50/51;
(Continued)

(56) References Cited

U.S. PATENT DOCUMENTS 6,131,057 A * 10/2000 Tamaki .................. B60L 3/04
701/22
2004/0001996 A1 * 1/2004 Sugimoto ........... H01M 10/482
429/61
(Continued)

FOREIGN PATENT DOCUMENTS

JP 2006149068 A * 6/2006 ............ H02J 7/0016
JP 2008-157808 7/2008
(Continued)

OTHER PUBLICATIONS

International Search Report of PCT application No. PCT/JP2019/049757 dated Mar. 10, 2020.

*Primary Examiner* — Dale W Hilgendorf
*Assistant Examiner* — Hana Lee
(74) *Attorney, Agent, or Firm* — WHDA, LLP

(57) ABSTRACT

Controller performs a plurality of pieces of abnormality diagnosing processing in a vehicle. The plurality of pieces of abnormality diagnosing processing includes a first-type abnormality diagnosing processing of detecting the abnormality that occurs due to a plurality of types of causes and a second-type abnormality diagnosing processing of detecting the abnormality that occurs due to one type of cause. When the abnormality is detected by the first-type abnormality diagnosing processing, controller specifies the cause of the abnormality detected by the first-type abnormality diagnosing processing based on a diagnosis result of the second-type abnormality diagnosing processing.

6 Claims, 9 Drawing Sheets

(51) Int. Cl.
*G01R 31/396* (2019.01)
*G07C 5/08* (2006.01)
*H01M 10/48* (2006.01)
*H01M 50/51* (2021.01)
*H04L 67/12* (2022.01)

(52) U.S. Cl.
CPC .......... *G07C 5/0808* (2013.01); *H01M 10/48* (2013.01); *H01M 10/482* (2013.01); *H01M 50/51* (2021.01); *B60L 2240/547* (2013.01); *H01M 2220/20* (2013.01); *H04L 67/12* (2013.01)

(58) Field of Classification Search
CPC ............... H01M 10/48; H01M 10/482; H01M 2220/20; G07C 5/0808; H04L 67/12
See application file for complete search history.

(56) References Cited

U.S. PATENT DOCUMENTS

| | | | |
|---|---|---|---|
| 2009/0130542 A1 | 5/2009 | Mizoguchi et al. | |
| 2012/0025769 A1* | 2/2012 | Kikuchi | B60L 58/14 |
| | | | 320/118 |
| 2012/0175953 A1 | 7/2012 | Ohkawa et al. | |
| 2014/0055896 A1* | 2/2014 | Muramoto | H02J 7/0016 |
| | | | 361/86 |
| 2018/0175779 A1* | 6/2018 | Koseki | H02P 29/032 |
| 2019/0047560 A1* | 2/2019 | Kinoshita | B60R 16/033 |
| 2019/0067962 A1 | 2/2019 | Matsubara et al. | |
| 2019/0275889 A1* | 9/2019 | Tashiro | B60L 3/0038 |

FOREIGN PATENT DOCUMENTS

| | | | | |
|---|---|---|---|---|
| JP | 2010-011722 | | 1/2010 | |
| JP | 2015156793 A | * | 8/2015 | .......... B60L 11/1879 |
| JP | 2018-057123 | | 4/2018 | |
| WO | 2011/037257 | | 3/2011 | |
| WO | 2017/159218 | | 9/2017 | |

* cited by examiner

FIG. 7
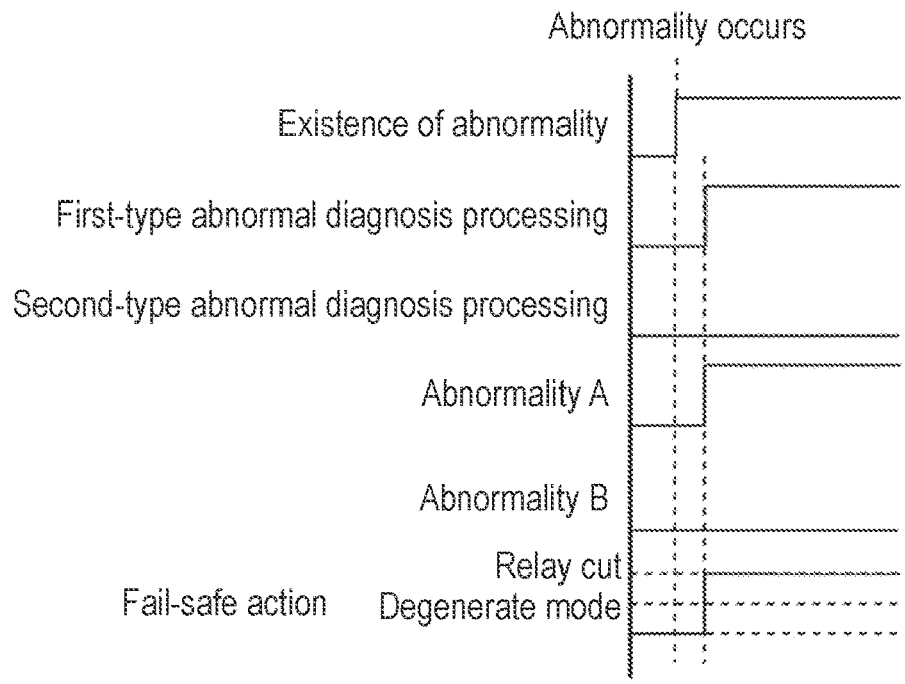
(a)
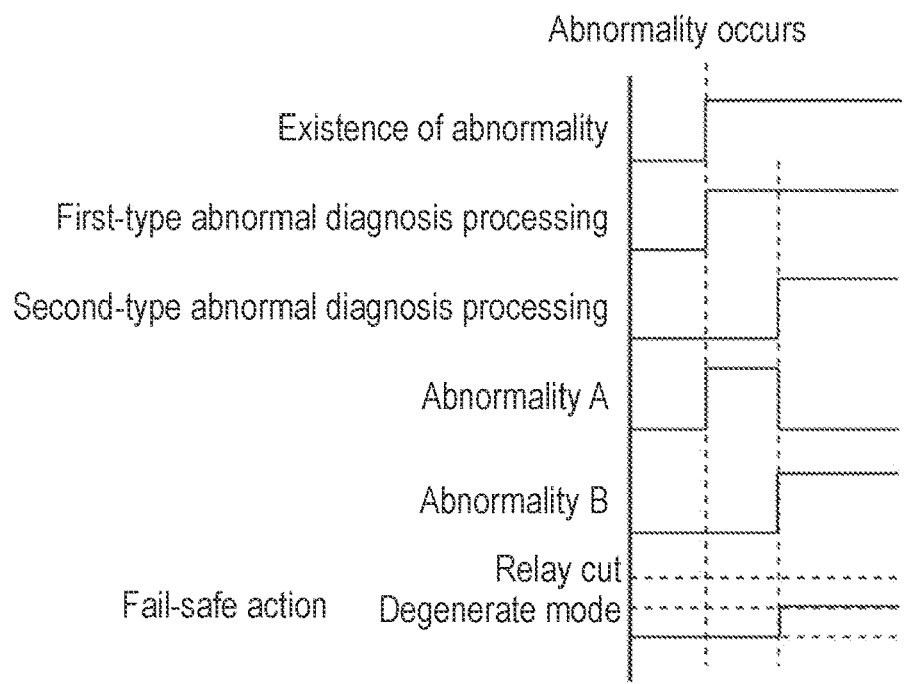
(b)

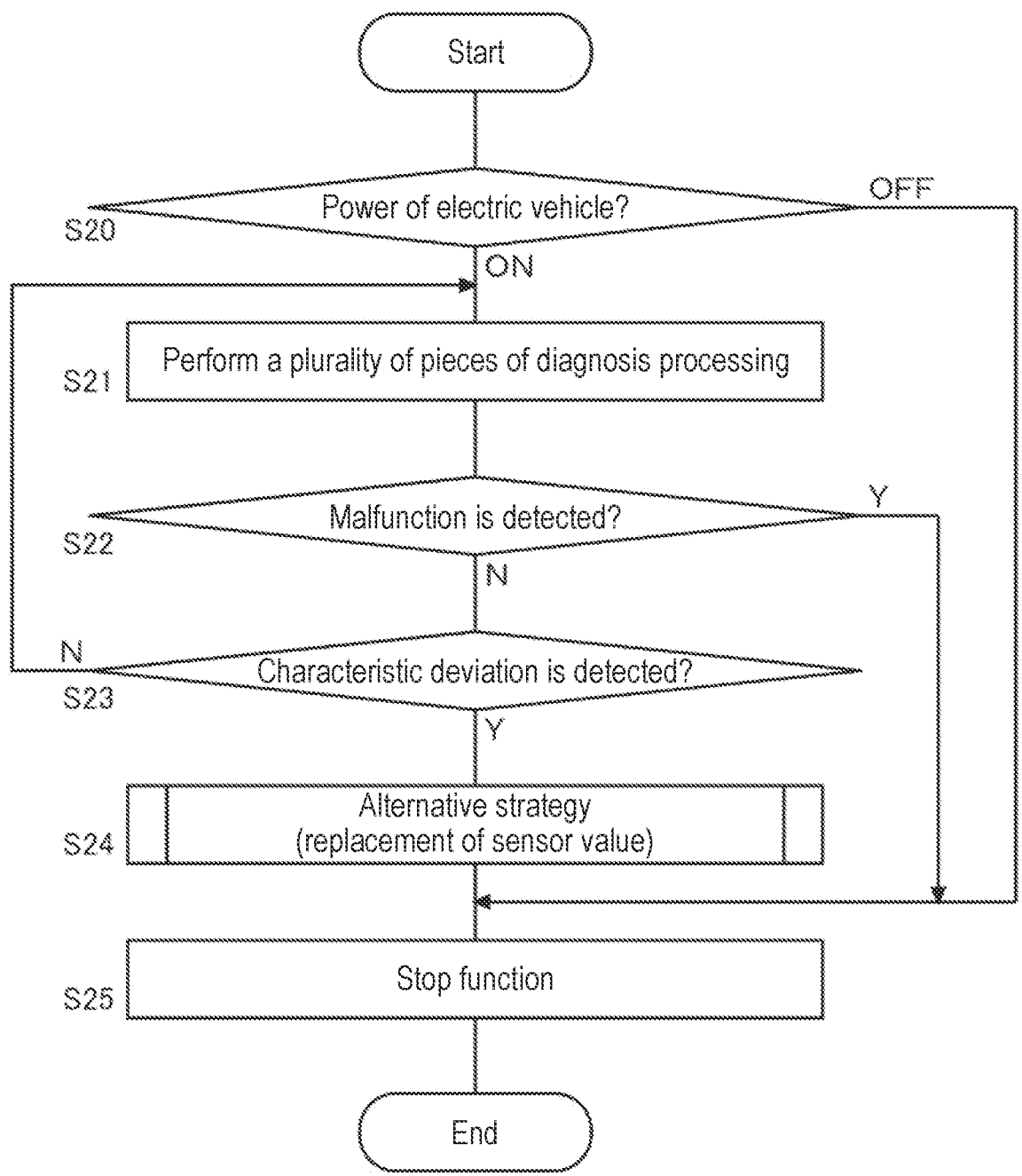

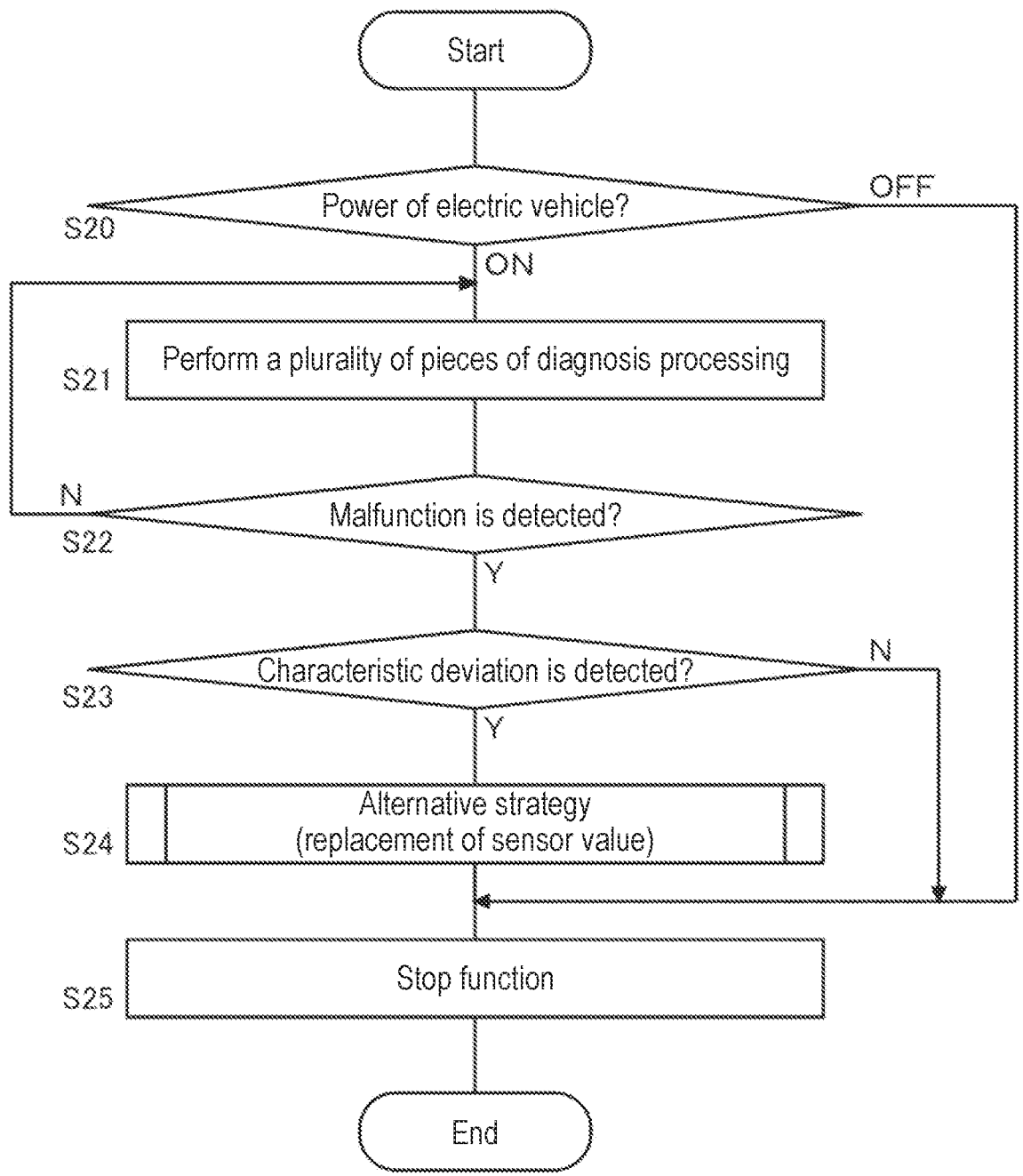

ABNORMALITY DIAGNOSING SYSTEM, AND POWER SUPPLY SYSTEM FOR VEHICLE

CROSS-REFERENCE TO RELATED APPLICATIONS

This application is a U.S. national stage application of the PCT International Application No. PCT/JP2019/049757 filed on Dec. 19, 2019, which claims the benefit of foreign priority of Japanese patent application No. 2019-040507 filed on Mar. 6, 2019, the contents all of which are incorporated herein by reference.

TECHNICAL FIELD

The present invention relates to an abnormality diagnosing system mounted on a vehicle and a power supply system for a vehicle.

BACKGROUND ART

In recent years, hybrid vehicles (HV), plug-in hybrid vehicles (PHV), and electric vehicles (EV) have become widespread. A power supply system including a secondary battery is mounted on these electric vehicles as a key device.

When an abnormality occurs in a sensor used in the power supply system, or when a harness connected to the sensor is disconnected, sensor information cannot be correctly acquired. Malfunction diagnosis processing is performed as a countermeasure to monitor a state of the sensor, the harness, and the like (see, for example, PTLs 1, 2). There are two types of failure diagnoses, namely, a type in which a plurality of failure causes are considered (first-type) and a type in which a single failure cause can be identified (second-type).

CITATION LIST

Patent Literature

PTL 1: WO 2017/159218
PTL 2: Unexamined Japanese Patent Publication No. 2018-57123

SUMMARY OF THE INVENTION

Technical Problem

When a first-type failure diagnosis and a second-type failure diagnosis are performed in parallel, a failure to be detected by the second-type failure diagnosis may possibly be detected by the first-type failure diagnosis due to a deviation in detection timing between the first-type failure diagnosis and the second-type failure diagnosis. In that case, there is a possibility that an error occurs in the identification of the failure cause. Because fail-safe action after the failure is detected by the failure diagnosis varies depending on the failure cause, there is a possibility that the fail-safe action not corresponding to the failure cause is performed, which may adversely affect safety and performance of the vehicle.

The present invention has been made in view of such a situation, and an object of the present invention is to provide a technique for correctly identifying the cause of the abnormality that occurs in the vehicle.

Solution to Problem

In order to solve the above problem, an abnormality diagnosing system according to an aspect of the present invention includes a controller that performs a plurality of pieces of abnormality diagnosing processing in a vehicle. The plurality of pieces of abnormality diagnosing processing includes a first-type abnormality diagnosing processing of detecting the abnormality that occurs due to a plurality of types of causes and a second-type abnormality diagnosing processing of detecting the abnormality that occurs due to one type of cause. When the abnormality is detected by the first-type abnormality diagnosing processing, the controller specifies the cause of the abnormality detected by the first-type abnormality diagnosing processing based on a diagnosis result of the second-type abnormality diagnosing processing.

An arbitrary combination of the above constituents and a conversion of the expressions of the present invention among methods, apparatuses, systems, and the like are also effective as an aspect of the present invention.

According to the present invention, the cause of the abnormality that occurs in the vehicle can correctly be identified.

BRIEF DESCRIPTION OF DRAWINGS

FIG. 7(a), (b) is view comparing the processing sequence of the comparative example and the processing sequence of the exemplary example.

FIG. 8 is a flowchart illustrating a processing sequence of a comparative example in abnormality diagnosing processing according to a second specific example.

FIG. 9 is a flowchart illustrating the processing sequence of the exemplary embodiment in the abnormality diagnosing processing of the second specific example.

DESCRIPTION OF EMBODIMENT

Figure 1:
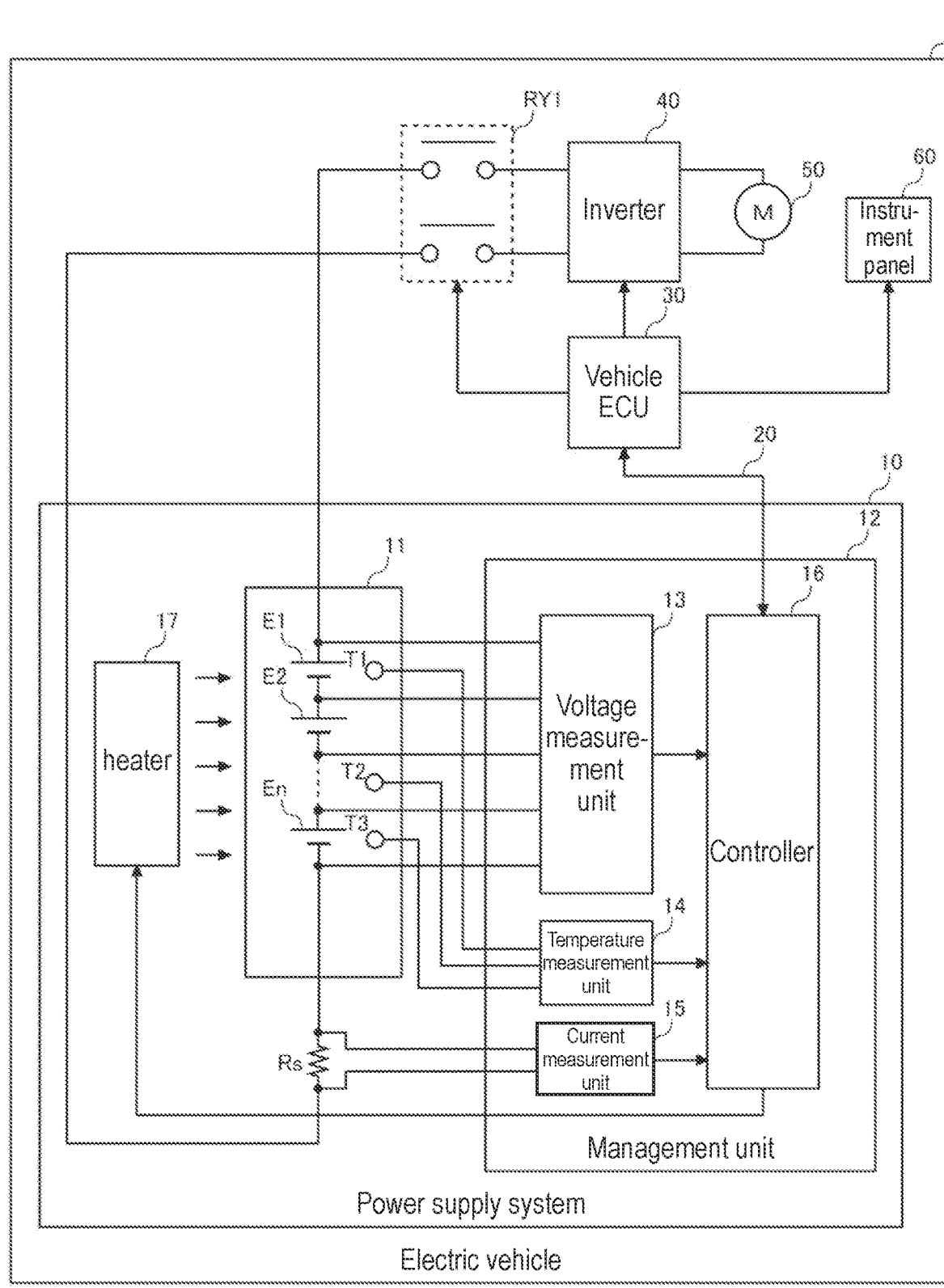
FIG. 1 is a view illustrating an electric vehicle equipped with a power supply system according to an exemplary embodiment of the present invention.

FIG. 1 is a view illustrating electric vehicle 1 equipped with power supply system 10 according to an exemplary embodiment of the present invention. Electric vehicle 1 is assumed to be a pure EV that is not equipped with an internal combustion engine.

Power supply system 10 is connected to motor 50 through relay RY1 and inverter 40. During power running, inverter 40 converts DC power supplied from power supply system 10 into AC power, and supplies the AC power to motor 50. During regeneration, the AC power supplied from motor 50 is converted into the DC power, and supplied to power supply system 10. Motor 50 is a three-phase AC motor, and rotates according to the AC power supplied from inverter 40 during the power running. During the regeneration, rotation energy due to deceleration is converted into the AC power, and supplied to inverter 40.

Relay RY1 is a contactor inserted between wirings connecting power supply system 10 and inverter 40. During traveling, vehicle electronic control unit (ECU) 30 controls relay RY1 to be in an on state (closed state), and electrically connects power supply system 10 and a power system of electric vehicle 1. When not traveling, vehicle ECU 30 controls relay RY1 to be in an off state (open state) in principle, and electrically interrupts power supply system 10 and the power system of electric vehicle 1. Instead of the relay, another type of switch such as a semiconductor switch may be used.

Power supply system 10 includes power storage unit 11, management unit 12, and heater 17. Power storage unit 11 includes a plurality of cells E1 to En connected in series. As a specific configuration example, power storage unit 11 includes one or a plurality of power storage modules. The plurality of power storage modules are configured to be connected in series or in series and parallel. Each power storage module includes a plurality of cells connected in series or in series and parallel. A lithium ion battery cell, a nickel hydrogen battery cell, a lead battery cell, an electric double layer capacitor cell, a lithium ion capacitor cell, or the like can be used as the cell. Hereinafter, an example using a lithium ion battery cell (nominal voltage: 3.6 to 3.7V) is assumed in the description. The number of series of cells E1 to En is determined according to a drive voltage at motor 50.

Shunt resistor Rs is connected in series with the plurality of cells E1 to En. Shunt resistor Rs functions as a current detection element. A Hall element may be used instead of shunt resistor Rs. A plurality of temperature sensors T1 to T3 that detects temperatures of the plurality of cells E1 to En are installed in power storage unit 11. One or two temperature sensors may be installed in each power storage module, or one temperature sensor may be installed in each of the plurality of cells. FIG. 1 illustrates an example in which three temperature sensors T1 to T3 are installed, but two or four or more temperature sensors may be installed. For example, a thermistor can be used as temperature sensors T1 to T3.

Management unit 12 includes voltage measurement unit 13, temperature measurement unit 14, current measurement unit 15, and controller 16. Nodes of the plurality of cells E1 to En connected in series and the voltage measurement unit 13 are connected by a plurality of voltage measurement lines. Voltage measurement unit 13 measures the voltage at each of cells E1 to En by measuring the voltage between two adjacent voltage measurement lines. Voltage measurement unit 13 transmits the measured voltages of cells E1 to En to controller 16.

Because voltage measurement unit 13 has a higher voltage than controller 16, voltage measurement unit 13 and controller 16 are connected by a communication line while are in an insulated state. Voltage measurement unit 13 can be configured by an application specific integrated circuit (ASIC) or a general-purpose analog front-end IC. Voltage measurement unit 13 includes a multiplexer and an A/D converter. The multiplexer outputs voltages between two adjacent voltage measurement lines to the A/D converter in order from the top. The A/D converter converts an analog voltage input from the multiplexer into a digital value.

Temperature measurement unit 14 includes a voltage dividing resistor and an A/D converter. The A/D converter sequentially converts a plurality of analog voltages divided by the plurality of temperature sensors T1 to T3 and the plurality of voltage dividing resistors into digital values, and outputs the digital values to controller 16. Controller 16 estimates the temperatures of the plurality of cells E1 to En based on the digital values. For example, controller 16 estimates the temperature of each of cells E1 to En based on a value measured by a temperature sensor most adjacent to each of cells E1 to En.

Current measurement unit 15 includes a differential amplifier and an A/D converter. The differential amplifier amplifies the voltage across shunt resistor Rs, and outputs the amplified voltage to the A/D converter. The A/D converter converts the voltage input from the differential amplifier into a digital value, and outputs the digital value to controller 16. Controller 16 estimates currents flowing through the plurality of cells E1 to En based on the digital values.

When an A/D converter is mounted in controller 16 while an analog input port is installed in controller 16, temperature measurement unit 14 and current measurement unit 15 may output an analog voltage to controller 16, and the analog voltage may be converted into a digital value by the A/D converter in controller 16.

Heater 17 is a heat source heating the plurality of cells E1 to En. Although not illustrated in FIG. 1, a cooling source (for example, a fan, a cooler, a water cooling system) that cools the plurality of E1 to En is also installed.

Controller 16 manages the states of the plurality of cells E1 to En based on the voltages, the temperatures, and the currents of the plurality of cells E1 to En measured by voltage measurement unit 13, temperature measurement unit 14, and current measurement unit 15. Controller 16 can be configured by a microcomputer and a nonvolatile memory (for example, an EEPROM and a flash memory).

Controller 16 and vehicle ECU 30 are connected by in-vehicle network 20. In-vehicle network 20 is constructed using at least one of standards such as a controller area network (CAN), a local interconnect network (LIN), FlexRay (registered trademark), and Ethernet (registered trademark). Controller 16 notifies vehicle ECU 30 of the states of the plurality of cells E1 to En through in-vehicle network 20.

Vehicle ECU 30 controls entire electric vehicle 1. For example, vehicle ECU 30 may include an integrated vehicle control module (VCM). In electric vehicle 1, instrument panel 60 is disposed facing a driver seat. Instrument panel 60 includes a tachometer, a speedometer, and various telltale lamps. The telltale lamp includes a caution lamp indicating abnormalities of various devices in electric vehicle 1.

When receiving the abnormality occurred in any device of electric vehicle 1 through in-vehicle network 20, vehicle ECU 30 turns on the corresponding caution lamp of instrument panel 60. When the caution lamp that requires repair of the device is turned on, a driver moves to a car dealer or a repair shop by self-propelling when the driver can travel. When the travel is not possible, a road service is used.

Controller 16 of power supply system 10 and vehicle ECU 30 perform various pieces of abnormality diagnosing processing (also referred to as failure diagnosis processing) in electric vehicle 1 alone or in cooperation with each other. In the description, a system that performs the abnormality diagnosing processing is referred to as an abnormality diagnosing system, and the abnormality diagnosing system includes at least one of controller 16 and vehicle ECU 30.

The abnormality diagnosing processing includes a first-type abnormality diagnosing processing of detecting the abnormality that can occur due to a plurality of types of causes and a second-type abnormality diagnosing processing of detecting the abnormality that occurs due to one identified cause. Hereinafter, a processing sequence in a case where the first-type abnormality diagnosing processing and the second-type abnormality diagnosing processing are performed in parallel will be described with a specific example. In a first specific example, processing sequences of the first-type abnormality diagnosing processing and the second-type abnormality diagnosing processing that detect the abnormality related to voltages of the plurality of cells E1 to En will be described.

Figure 2:
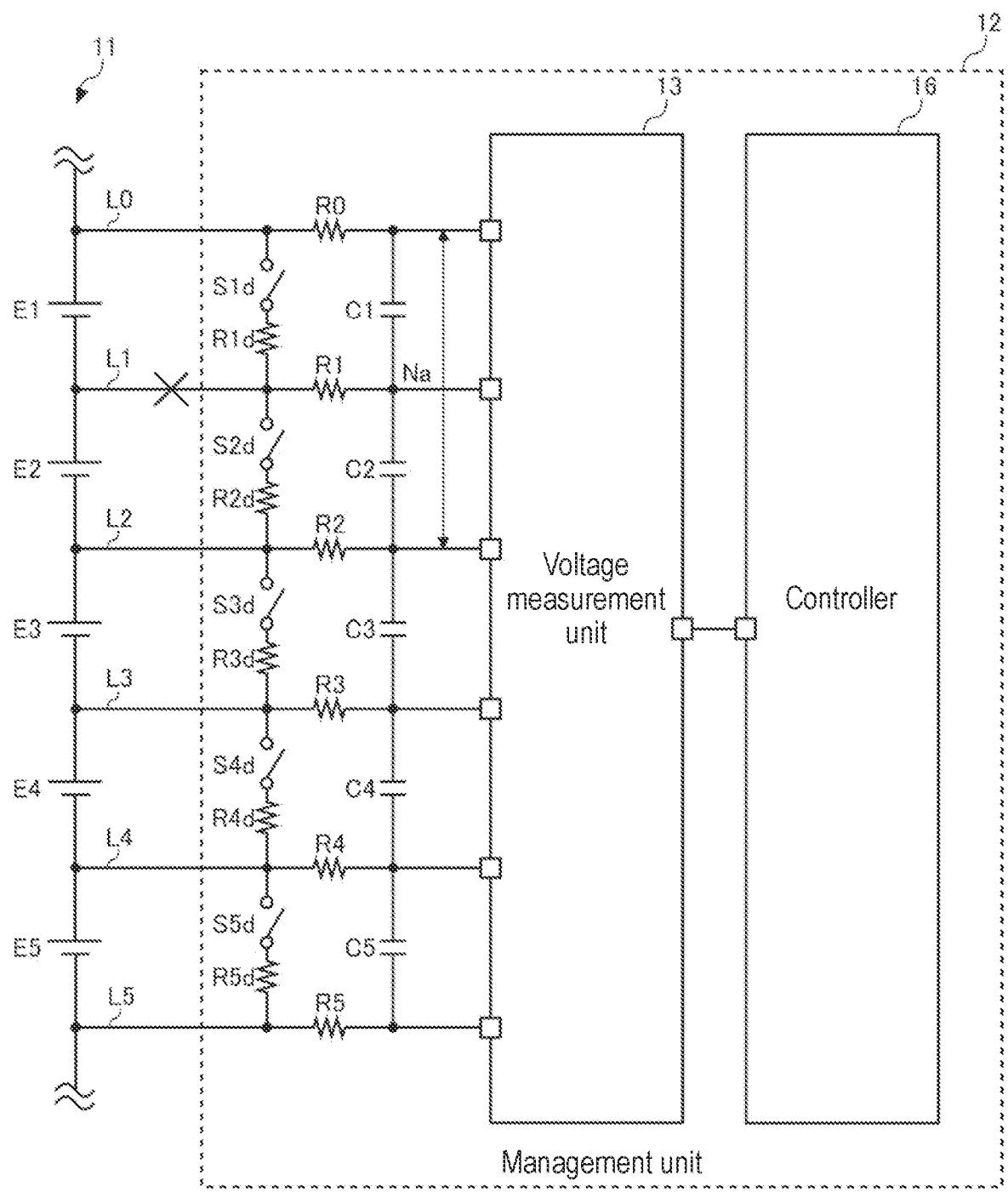
FIG. 2 is a partial circuit diagram illustrating abnormality diagnosing processing according to a first specific example.

FIG. 2 is a partial circuit diagram illustrating the abnormality diagnosing processing according to the first specific example. FIG. 2 illustrates an example in which power storage unit 11 includes five cells E1 to E5 connected in series. Voltage measurement unit 13 is connected to each node between five cells E1 to E5 connected in series by a plurality of voltage measurement lines L0 to L5, measures the voltage between two adjacent voltage measurement lines, and measures the voltage at each of cells E1 to E5.

Resistors R0 to R5 are inserted into the plurality of voltage measurement lines L0 to L5, respectively. A discharge circuit is connected between two adjacent voltage measurement lines of the plurality of voltage measurement lines L0 to L5. Each discharge circuit is constructed with a series circuit of discharge switches S1d to S5d and discharge resistors R1d to R5d. For example, a metal oxide semiconductor field effect transistor (MOSFET) can be used as discharge switches S1d to S5d. The discharge circuit is mainly used for equalization processing of the plurality of cells E1 to E5.

Capacitors C1 to C5 are connected in parallel with the plurality of cells E1 to E5 between two adjacent voltage measurement lines of the plurality of voltage measurement lines L0 to L5. Capacitors C1 to C5 function to stabilize respective potentials of the plurality of voltage measurement lines L0 to L5.

Controller 16 acquires voltage values of the plurality of cells E1 to E5 from voltage measurement unit 13. For example, a signal is transmitted and received between voltage measurement unit 13 and controller 16 by communication using an insulating interface.

Controller 16 has an equalization processing function, and periodically performs the equalization processing on the plurality of cells E1 to E5. For example, controller 16 adjusts the voltages of the plurality of other cells to the voltage at the cell having the lowest voltage among the plurality of cells E1 to E5. Specifically, controller 16 turns on the discharge switches of the plurality of other cells to discharge the plurality of other cells. When the voltage at each of the other cells reaches the voltage at the cell having the lowest voltage, controller 16 turns off the discharge switch of each of the other cells.

Controller 16 performs detection processing of overvoltage (OV)/undervoltage (UV) of the cell voltage as the first-type abnormality diagnosing processing. Controller 16 monitors each voltage at the plurality of cells E1 to E5. Controller 16 compares the voltage at each cell with an OV threshold, and determines that the cell having the voltage higher than the OV threshold is overcharged.

In addition, controller 16 performs disconnection detection processing of the plurality of voltage measurement lines L0 to L5 as the second-type abnormality diagnosing processing. In this processing, controller 16 diagnoses whether any one of the plurality of voltage measurement lines L0 to L5 is disconnected. Controller 16 turns on the plurality of discharge switches S1d to S5d at predetermined time intervals. By the turn-on, the potentials of the plurality of voltage measurement lines L0 to L5 converge to the potential of the lowermost voltage measurement line L5 (for example, 0 V).

In this state, the potentials of the plurality of cells E1 to E5 measured by voltage measurement unit 13 do not indicate the voltages of the plurality of cells E1 to E5. Consequently, controller 16 interrupts the OV/UV detection processing of the cell voltage while performing the disconnection detection processing of the plurality of voltage measurement lines L0 to L5.

After turning on the plurality of discharge switches S1d to S5d, controller 16 turns off the plurality of discharge switches S1d to S5d after a lapse of a predetermined time. By the turn-off, the potentials of the plurality of cells E1 to E5 measured by voltage measurement unit 13 return to the state indicating the voltages of the plurality of cells E1 to E5. When the cell in which the cell voltage after the turn-off of the plurality of discharge switches S1d to S5d is not recovered to the voltage substantially equal to the cell voltage before the turn-on of the plurality of discharge switches S1d to S5d, controller 16 determines that the disconnection occurs in the voltage measurement line connected to the cell. After turning off the plurality of discharge switches S1d to S5d, controller 16 resumes the OV/UV detection processing of the cell voltage.

When the disconnection occurs in a certain voltage measurement line, the voltages of two cells connected to the voltage measurement line are affected. FIG. 2 illustrates the state in which first voltage measurement line L1 is disconnected. Even when first voltage measurement line L1 is disconnected, the voltages of first cell E1 and second cell E2 do not immediately reach the OV threshold/UV threshold, but remain in the normal range for a certain period. The reason why the voltages of first cell E1 and second cell E2 do not immediately reach the OV threshold/UV threshold is that impedances between 0th voltage measurement line L0 and second voltage measurement line L2 above and below a disconnection location are balanced and charges in first capacitor C1 and second capacitor C2 do not immediately come off. The charges in first capacitor C1 and second capacitor C2 gradually come out due to a wiring resistance in voltage measurement unit 13 or the like, and accordingly the potential of node Na between first capacitor C1 and second capacitor C2 gradually decreases. Finally, the voltage at first cell E1 reaches an upper limit value, and the voltage at second cell E2 reaches a lower limit value.

A switch dedicated to disconnection detection may be provided separately from the plurality of discharge switches S1d to S5d between each of the plurality of voltage measurement lines L0 to L5 and the ground potential. In this case, controller 16 performs the disconnection detection processing using the switch dedicated to disconnection detection with no use of the plurality of discharge switches S1d to S5d.

Figure 3:
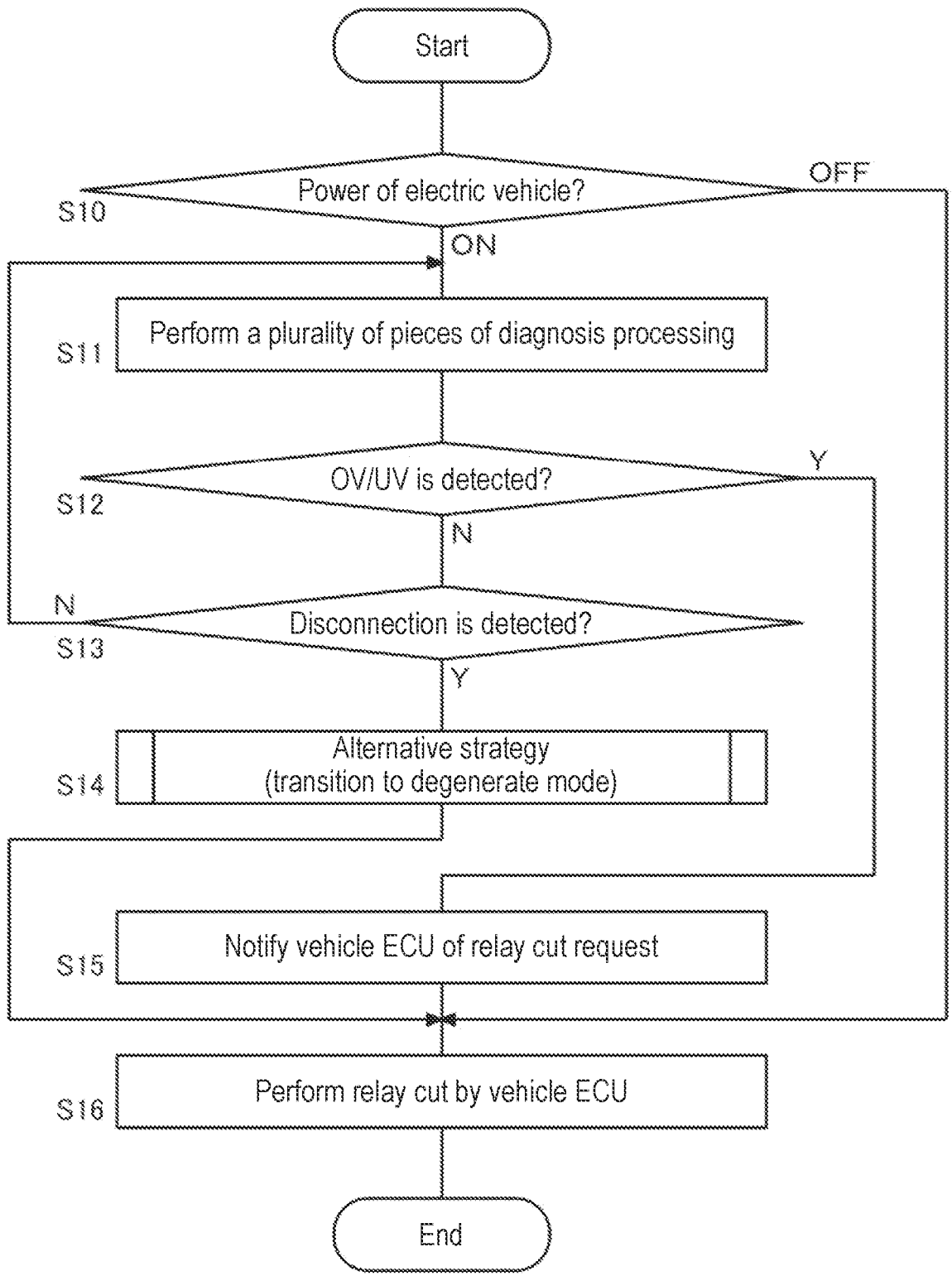
FIG. 3 is a flowchart illustrating a processing sequence according to a comparative example in the abnormality diagnosing processing of the first specific example.
Figure 4:
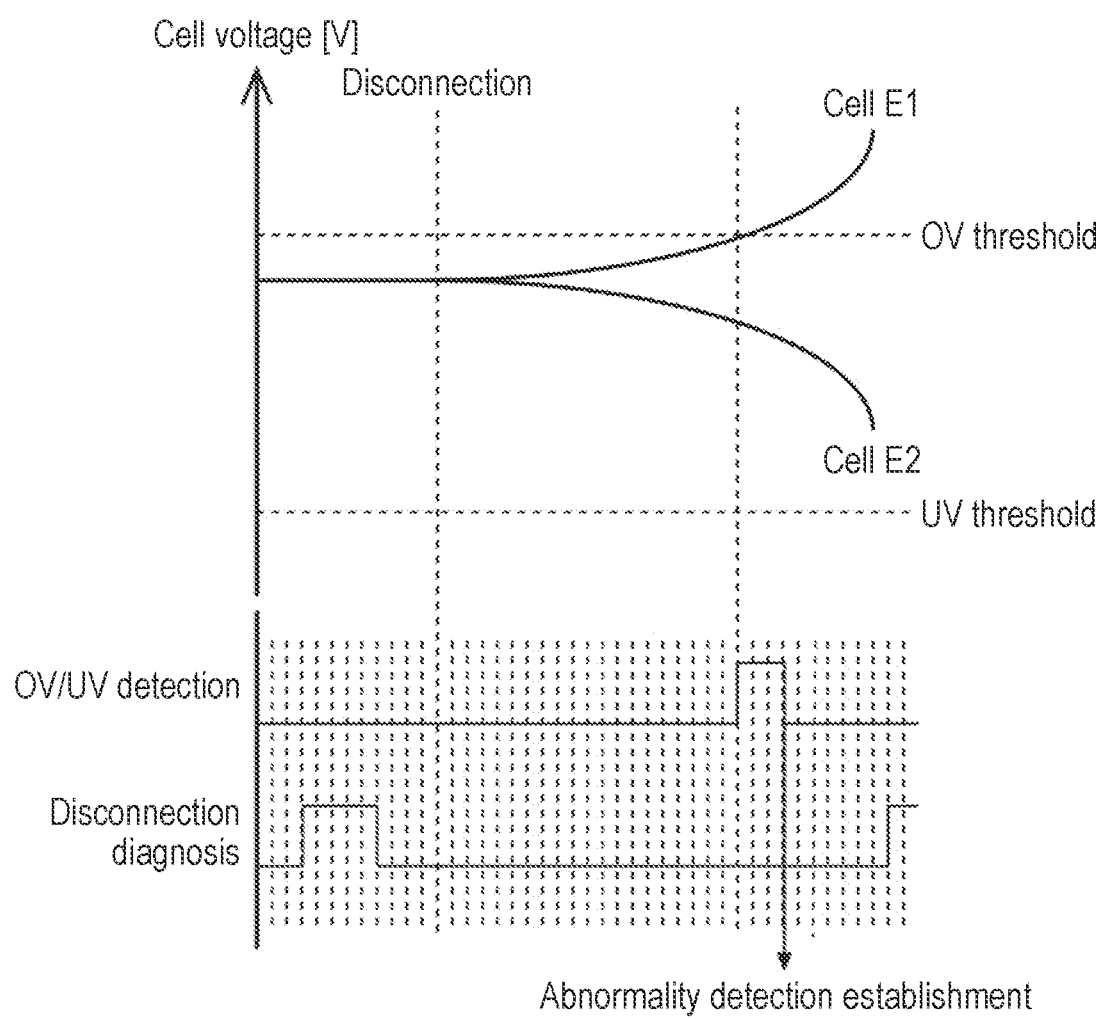
FIG. 4 is a view illustrating an example of voltage behavior of a first cell and a second cell when a processing sequence of the comparative example is performed in the abnormality diagnosing processing of the first specific example.

FIG. 3 is a flowchart illustrating a processing sequence according to a comparative example in the abnormality diagnosing processing of the first specific example. FIG. 4 is a view illustrating an example of voltage behavior of first cell E1 and second cell E when a processing sequence of the comparative example is performed in the abnormality diagnosing processing of the first specific example.

When electric vehicle 1 is powered on (ON in step S10), controller 16 performs a plurality of pieces of abnormality diagnosing processing related to the voltages of the plurality of cells E1 to En in parallel (S11). In the example of FIGS. 3 and 4, controller 16 performs the OV/UV detection processing of the cell voltage and the disconnection detection processing in parallel. Controller 16 always performs the OV/UV detection processing of the cell voltage. Controller 16 performs the disconnection detection processing at predetermined time intervals (for example, every 20 seconds). The OV/UV detection processing of the cell voltage is interrupted while the disconnection detection processing is performed. Controller 16 may intermittently perform the OV/UV detection processing of the cell voltage at a period shorter than the period of the disconnection detection processing.

A flag of the OV/UV detection processing of the cell voltage illustrated in the lower part of FIG. 4 indicates the state in which the abnormality is not detected when the flag is low, and indicates that the abnormality is detected when the flag is high. The flag of the disconnection detection processing indicates the state in which the disconnection diagnosis is not performed when the flag is low, and indicates the state in which the disconnection diagnosis is performed when the flag is high.

In FIG. 4, when the disconnection occurs in first voltage measurement line L1 (see FIG. 2), because the disconnection diagnosis is not performed, controller 16 cannot immediately detect the disconnection by the disconnection detection processing. After the disconnection, the voltage at first cell E1 gradually increases, and the voltage at second cell E2 gradually decreases. When the voltage at first cell E1 reaches the OV threshold, controller 16 detects the OV of the cell voltage. Then, controller 16 detects the disconnection of first voltage measurement line L1 by the first disconnection diagnosis after the occurrence of the disconnection.

Controller 16 establishes the abnormality when the abnormal state continues for a specified time or more. In the example of FIG. 4, controller 16 establishes the OV of the cell voltage when the voltage at first cell E1 exceeds continuously the OV threshold for the specified time or more.

When the OV/UV of the cell voltage is detected, controller 16 transmits a relay cut request to vehicle ECU 30 through in-vehicle network 20. When the disconnection of the voltage measurement line is detected, controller 16 performs a fail-safe action corresponding to the disconnection of the voltage measurement line. For example, controller 16 performs transition to a degenerate mode as the fail-safe action corresponding to the disconnection of the voltage measurement line.

For example, controller 16 transmits an upper limit value change request to instruct the change of the upper limit power value or the upper limit current value of inverter 40 to a value lower than the normal value to vehicle ECU 30 through in-vehicle network 20. When receiving the upper limit value change request, vehicle ECU 30 changes the upper limit power value or the upper limit current value of inverter 40 to the value in the degenerate mode. The upper limit value may be defined not by a power value or a current value but by a speed. Controller 16 may limit an SOC use range of the cell in the degenerate mode. For example, when the SOC use range of the normal mode is 20 to 80%, the SOC use range of the degenerate mode is limited to 40 to 60%.

The description returns to FIG. 3. When detecting the OV/UV in the plurality of pieces of abnormality diagnosing processing related to the voltages of the plurality of cells E1 to En (Y in S12), controller 16 transmits the relay cut request to vehicle ECU 30 through in-vehicle network 20 (S15). When receiving the relay cut request, vehicle ECU 30 controls relay R1 to be turned off (S16). When detecting the disconnection of the voltage measurement line in the plurality of pieces of abnormality diagnosing processing related to the voltages of the plurality of cells E1 to En (N in S12, Y in S13), controller 16 performs the fail-safe action corresponding to the disconnection of the voltage measurement line as an alternative strategy (S14). When the processing according to the alternative strategy is ended, vehicle ECU 30 controls relay R1 to be turned off (S16). When the power of electric vehicle 1 is turned off (OFF in step S10), vehicle ECU 30 controls relay R1 to be turned off (S16).

Figure 5:
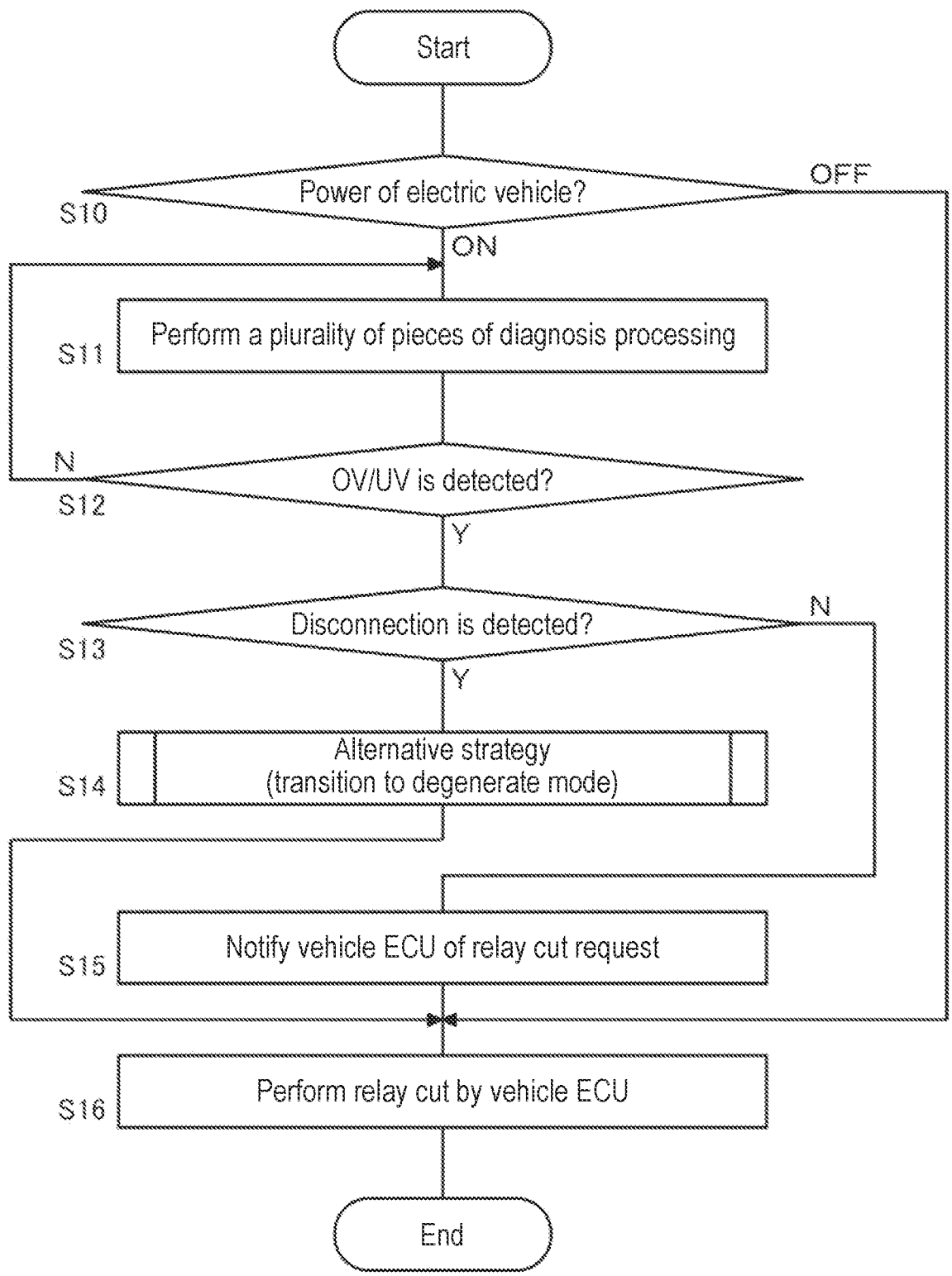
FIG. 5 is a flowchart illustrating a processing sequence of the exemplary embodiment in the abnormality diagnosing processing of the first specific example.
Figure 6:
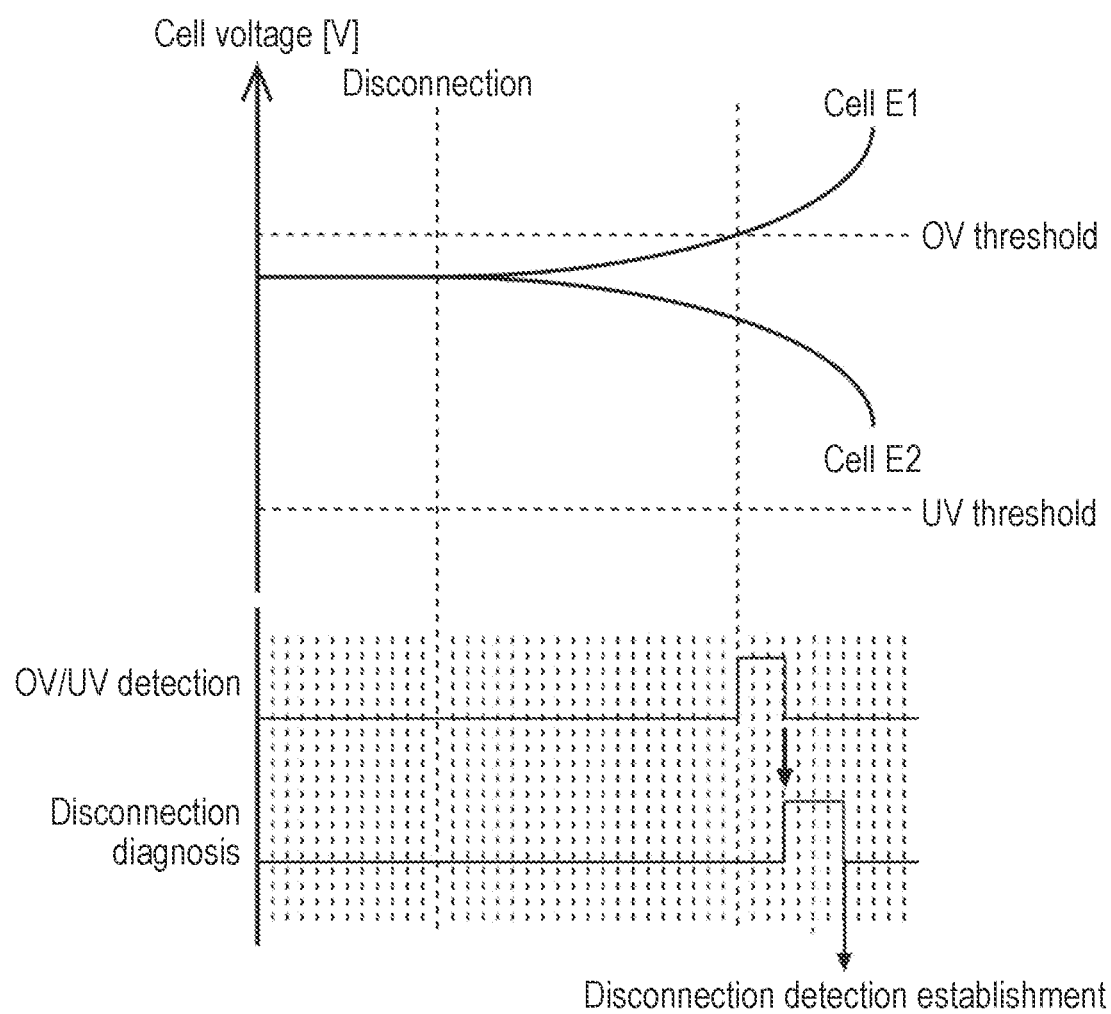
FIG. 6 is a view illustrating an example of the voltage behavior of the first cell and the second cell when the processing sequence of the exemplary embodiment is performed in the abnormality diagnosing processing of the first specific example.

FIG. 5 is a flowchart illustrating a processing sequence of the exemplary embodiment in the abnormality diagnosing processing of the first specific example. FIG. 6 is a view illustrating an example of the voltage behavior of first cell E1 and second cell E when the processing sequence of the exemplary embodiment is performed in the abnormality diagnosing processing of the first specific example. In FIG. 5, when electric vehicle 1 is powered on (ON in step S10), controller 16 performs the plurality of pieces of abnormality diagnosing processing related to the voltages of the plurality of cells E1 to En in parallel (S11).

In FIG. 6, when the voltage of first cell E1 exceeds the OV threshold after the disconnection of first voltage measurement line L1, controller 16 detects the OV of the cell voltage. In the exemplary embodiment, when the abnormality is detected in the OV/UV detection processing of the cell voltage that is the first-type abnormality diagnosing processing, controller 16 immediately performs the disconnection detection processing that is the second-type abnormality diagnosing processing with the detection of the abnormality as a trigger. That is, when the abnormality is detected in the OV/UV detection processing of the cell voltage, controller 16 immediately performs the disconnection detection processing regardless of periodic performance timing of the disconnection detection processing. Controller 16 detects the disconnection of first voltage measurement line L1 by performing the disconnection detection processing.

When the disconnection is detected by the disconnection detection processing that is the second-type abnormality diagnosing processing, controller 16 immediately performs the fail-safe action corresponding to the disconnection of the voltage measurement line.

The description returns to FIG. 5. When detecting the OV/UV of the cell voltage in the OV/UV detection processing of the cell voltage that is the first-type abnormality diagnosing processing among the plurality of pieces of abnormality diagnosing processing related to the voltages of the plurality of cells E1 to En (Y in S12), controller 16 performs the disconnection detection processing that is the second-type abnormality diagnosing processing (S13).

When the disconnection of the voltage measurement line is detected by the disconnection detection processing (Y in S13), controller 16 determines that the cause of the abnormality is the disconnection of the voltage measurement line, and performs the fail-safe action corresponding to the disconnection of the voltage measurement line as the alternative strategy (S14). When the processing according to the alternative strategy is ended, vehicle ECU 30 controls relay R1 to be turned off (S16). When the disconnection of the voltage measurement line is not detected by the disconnection detection processing (N in S13), controller 16 determines that the cause of the abnormality is the OV/UV of the cell voltage, and transmits the relay cut request to vehicle ECU 30 through in-vehicle network 20 (S15). When receiving the relay cut request, vehicle ECU 30 controls relay R1 to be turned off (S16). When the power of electric vehicle 1 is turned off (OFF in step S10), vehicle ECU 30 controls relay R1 to be turned off (S16).

When the disconnection of the voltage measurement line is previously detected by the disconnection detection processing that is the second-type abnormality diagnosing processing, controller 16 immediately determines that the disconnection of the voltage measurement line occurs and shifts to the degenerate mode. In this case, necessity to wait for the result of the cell voltage OV/UV detection processing that is the first-type abnormality diagnosing processing is eliminated.

FIG. 7(*a*), (*b*) is view comparing the processing sequence of the comparative example and the processing sequence of the exemplary example. FIG. 7(*a*) illustrates the processing sequence of the comparative example, and FIG. 7(*b*) illustrates the processing sequence of the exemplary example. As illustrated in FIG. 7(*a*), in the comparative example, after the occurrence of the abnormality, when the abnormality is detected in the first-type abnormality diagnosing processing before the second-type abnormality diagnosing processing, the relay cut is performed.

In the examples of FIGS. 3 to 6, abnormality A is the OV/UV of the cell voltage, abnormality B is the disconnection of the voltage measurement line, and the abnormality that occurs actually is disconnection of the voltage measurement line. Consequently, it should originally shift to the degenerate mode as the fail-safe action. However, the relay is immediately cut off, and electric vehicle 1 stops.

On the other hand, as illustrated in FIG. 7(*b*), in the exemplary embodiment, after the abnormality occurs, when the first-type abnormality diagnosing processing detects the abnormality before the second-type abnormality diagnosing processing, the second-type abnormality diagnosing processing is immediately performed. When the disconnection is detected by the second-type abnormality diagnosing processing, the relay cut is not performed and the mode shifts to the degenerate mode.

As described above, in the exemplary embodiment, when the abnormality is detected in the first-type abnormality diagnosing processing, the second-type abnormality diagnosing processing is performed using the abnormality as a trigger. This makes it possible to early and correctly identify the cause of the abnormality. Consequently, the correct fail-safe action can be performed according to the cause of the abnormality. On the other hand, in the comparative example, an erroneous diagnosis of the OV/UV of the cell voltage is made for the disconnection of the voltage measurement line that occurs actually, and the relay cut is performed based on the erroneous diagnosis.

When once the abnormality related to the cell voltage is detected in the abnormality diagnosing processing related to the cell voltage, in the case of design in which the content of the abnormality diagnosis is not canceled until the completion of repair or component replacement that eliminates the abnormality, the erroneous fail-safe action continues permanently.

The two fail-safe actions of the relay cut and the transition to the degenerate mode are prepared to achieve both safety and convenience. In the pure electric vehicle (EV) on which the internal combustion engine is not mounted, possibility that the electric vehicle (EV) cannot stop in a safe place when power supply system 10 stops suddenly. In addition, even when the electric vehicle (EV) can stop at the safe place, the electric vehicle (EV) cannot self-travel after that, and thus the convenience of the user is deteriorated. Consequently, the pure electric vehicle (EV) is required to achieve both establishment of vehicle safety and continuation of basic performance (running, turning, stopping).

In the case of relatively minor abnormality, the transition to the degenerate mode is only made, and a self-propelled state is secured. On the other hand, in the case of severe abnormality, the relay cut is performed to secure the safety of the vehicle. In the case of a hybrid vehicle (HV) and a plug-in hybrid vehicle (PHV), the relay cut may be performed for all abnormalities.

In addition, by correctly identifying the cause of the abnormality, a failed component that needs to be replaced can be correctly identified, and unnecessary replacement of a normal component can be prevented. For example, when the failure location can be identified by the voltage measurement line, necessity to replace cells E1 to En in power storage unit 11 is eliminated.

A second specific example will be described below. In the second specific example, the processing sequences of the first-type abnormality diagnosing processing and the second-type abnormality diagnosing processing for detecting the abnormality related to the temperature control system of the plurality of cells E1 to En will be described.

Controller 16 performs a malfunction detection processing of the temperature control system of a heating system as the first-type abnormality diagnosing processing. Controller 16 controls heater 17 such that the temperature of the cell measured by a certain temperature sensor becomes a target temperature. Controller 16 calculates an amount of heat required to set the temperature of the cell to the target temperature from a deviation between the temperature of the cell to the target temperature, and determines a heating amount per unit time and a heating time. Controller 16 generates a predicted temperature transition of the cell based on the determined heating amount per unit time and heating time. For example, when the temperature of the cell measured by the temperature sensor is 10° C. and the target temperature is 25° C., the deviation is 15° C.

When the difference between the temperature of the cell measured by the temperature sensor and the temperature on the predicted temperature transition deviates by a predetermined set value or more, controller 16 determines that the temperature control system of the heating system malfunctions. The malfunction of the temperature control system of the heating system may be caused by the failure of heater 17, the failure of the temperature sensor, or the like.

In addition, controller 16 performs malfunction detection processing of the temperature control system of the cooling system as the first-type abnormality diagnosing processing. Controller 16 controls a fan, a cooler, or a water-cooling system (not illustrated) such that the temperature of the cell measured by a certain temperature sensor becomes the target temperature. Controller 16 calculates a cooling amount necessary for setting the temperature of the cell to the target temperature from the deviation between the temperature of the cell and the target temperature, and determines the cooling amount per unit time and the cooling time. Controller 16 generates the predicted temperature transition of the cell based on the determined cooling amount per unit time and cooling time. For example, when the temperature of the cell measured by the temperature sensor is 40° C. and the target temperature is 25° C., the deviation is 15° C.

When the difference between the temperature of the cell measured by the temperature sensor and the temperature on the predicted temperature transition deviates by a predetermined set value or more, controller 16 determines that the temperature control system of the cooling system malfunctions. The failure of the fan, a cooler, or the water-cooling system (not illustrated), the failure of the temperature sensor, or the like can be considered as the cause of the malfunction of the temperature control system of the cooling system.

In addition, controller 16 performs detection processing of characteristic deviation of temperature sensors T1 to T3 as the second-type abnormality diagnosing processing. The characteristic deviation is the state in which the deviation exceeding an allowable value occurs in the normal measurement range of the temperature sensor. The characteristic deviation also includes the deviation exceeding an allowable value of an offset position.

When the measurement value of the temperature sensor deviates from the normal measurement range including an allowable error, controller 16 determines that the characteristic deviation occurs in the temperature sensor. When only one output value among the plurality of temperature sensors greatly deviates from the output values of other temperature sensors, controller 16 determines that the characteristic deviation occurs in the temperature sensor of which the output value deviates. For example, the temperature sensor having an output value deviated from an average value of the output values of the plurality of temperature sensors by a predetermined set value or more is determined as the temperature sensor in which the characteristic deviation occurs. Controller 16 performs this determination processing at predetermined time intervals.

In addition, controller 16 performs detection processing of output stickiness of temperature sensors T1 to T3 as the second-type abnormality diagnosing processing. The output sticking is the state in which the output value of the temperature sensor sticks to the upper limit value or the lower limit value of the temperature sensor.

FIG. 8 is a flowchart illustrating the processing sequence of the comparative example in abnormality diagnosing processing according to a second specific example. When electric vehicle 1 is powered on (ON in step S20), controller 16 performs the plurality of pieces of abnormality diagnosing processing related to the temperature control system in parallel (S21). When detecting the malfunction of the temperature control system in the plurality of pieces of abnormality diagnosing processing (Y in S22), controller 16 stops the function of the temperature control system (S25). When detecting the characteristic deviation of the temperature sensor among the plurality of pieces of abnormality diagnosing processing (N in S22, Y in S23), controller 16 performs the fail-safe action corresponding to the characteristic deviation of the temperature sensor as the alternative strategy (S24). For example, the output value of the temperature sensor in which the characteristic deviation occurs is replaced with the output value of the normal temperature sensor installed at a position closest to the temperature sensor. Controller 16 may specify the output value of the normal temperature sensor having the closest behavior to the output value of the temperature sensor in which the characteristic deviation occurs, and add a difference between the output values to the output value of the temperature sensor in which the characteristic deviation occurs. When the processing by the alternative strategy is ended, controller 16 stops the function of the temperature control system (S25). When electric vehicle 1 is powered off (OFF in step S20), controller 16 stops the function of the temperature control system (S25).

FIG. 9 is a flowchart illustrating the processing sequence of the exemplary embodiment in the abnormality diagnosing processing of the second specific example. When electric vehicle 1 is powered on (ON in step S20), controller 16 performs the plurality of pieces of abnormality diagnosing processing related to the temperature control system in parallel (S11). When detecting the malfunction of the temperature control system in the malfunction detection processing of the temperature control system that is the first-type abnormality diagnosing processing among the plurality of pieces of abnormality diagnosing processing (Y in S22), controller 16 performs the characteristic deviation detection processing of the temperature sensor that is the second-type abnormality diagnosing processing (S23). For example, controller 16 determines whether the temperature sensor in which the output value greatly deviates from the output values of other temperature sensors exists among the plurality of temperature sensors.

When the temperature sensor in which the characteristic deviation occurs is detected by the characteristic deviation detection processing of the temperature sensor (Y in S23), controller 16 determines that the characteristic deviation occurs in the specific temperature sensor, and performs the fail-safe action corresponding to the characteristic deviation of the temperature sensor as the alternative strategy (S24). For example, controller 16 replaces the output value of the temperature sensor in which the characteristic deviation occurs with the output value of the normal temperature sensor installed at the position closest to the temperature sensor. When the processing by the alternative strategy is ended, controller 16 stops the function of the temperature control system (S25).

When the temperature sensor in which the characteristic deviation occurs is not detected by the characteristic deviation detection processing of the temperature sensor (N in S23), controller 16 determines that the temperature control system malfunctions, and stops the function of the temperature control system (S25). When electric vehicle 1 is powered off (OFF in step S20), controller 16 stops the function of the temperature control system (S25).

When the characteristic deviation of the temperature sensor is previously detected by the characteristic deviation detection processing of the temperature sensor that is the second-type abnormality diagnosing processing, controller 16 immediately replaces the output value of the temperature sensor in which the characteristic deviation occurs with the output value of the normal temperature sensor installed at the position closest to the temperature sensor. In this case, necessity to wait for the result of the malfunction detection processing of the temperature control system that is the first-type abnormality diagnosing processing is eliminated.

Also in the second specific example, in the exemplary embodiment, when the abnormality is detected in the first-type abnormality diagnosing processing, the second-type abnormality diagnosing processing is performed with the abnormality as the trigger. This makes it possible to early and correctly identify the cause of the abnormality. Consequently, the correct fail-safe action can be performed according to the cause of the abnormality. On the other hand, in the comparative example, the abnormality of one temperature sensor is diagnosed as the malfunction of the temperature control system, and the function of the temperature control system is stopped based on the diagnosis. However, in the case of power supply system 10 equipped with a large number of temperature sensors, the abnormality of one temperature sensor is a relatively minor abnormality, and the output value of another temperature sensor can be replaced. In that case, necessity to stop the function of the temperature control system is low. Consequently, when the abnormality occurs in one temperature sensor, the fail-safe action in which the function of the temperature control system is not stopped but the output value of another temperature sensor is replaced is more convenient for the user.

In addition, by correctly identifying the cause of the abnormality, a failed component that needs to be replaced can be correctly identified, and unnecessary replacement of a normal component can be prevented. For example, when the failure location can be identified in one temperature sensor, only the temperature sensor may be replaced, and necessity to replace heater 17, the fan, and the like is eliminated.

The present invention is described above based on the exemplary embodiment. It will be understood by those skilled in the art that the exemplary embodiment is merely the example, other exemplary modifications in which each component and/or each processing of the exemplary embodiment is variously combined are possible, and the other exemplary modifications still fall within the scope of the present invention.

The first specific example describes the plurality of pieces of abnormality diagnosing processing related to the voltages of the plurality of cells E1 to En, and the second specific example describes the plurality of pieces of abnormality diagnosing processing related to the temperature control system. In this regard, in the case of the plurality of pieces of abnormality diagnosing processing related to the current flowing through power storage unit 11, the first-type abnormality diagnosing processing includes processing of monitoring whether an overcurrent flows through the current path. The second-type abnormality diagnosing processing includes processing of detecting the characteristic deviation of the current sensor. When the overcurrent is detected by the first-type abnormality diagnosing processing, for example, controller 16 performs the relay cut. When the characteristic deviation of the current sensor is detected by the second-type abnormality diagnosing processing in the case where the plurality of current sensors are installed, for example, controller 16 shifts to the degenerate mode.

In the exemplary embodiments of the first and second specific examples, an example in which the first-type abnormality diagnosing processing and the second-type abnormality diagnosing processing are performed in parallel has been described. In this regard, controller 16 may perform the second abnormality diagnosing processing only once after the power of electric vehicle 1 is turned on and then stop the second abnormality diagnosing processing. Controller 16 performs only the first-type abnormality diagnosing processing in the normal state, and controller 16 performs the second abnormality diagnosing processing with the abnormality as the trigger when the abnormality is detected by the first-type abnormality diagnosing processing. For example, in the first specific example, the disconnection detection processing is not executed in the normal state, so that the period in which the cell voltage is not measured can be eliminated. In addition, a processing load of controller 16 can be reduced. On the other hand, in the example in which the first-type abnormality diagnosing processing and the second-type abnormality diagnosing processing are performed in parallel, redundancy is increased, and robustness related to the abnormality detection is improved.

In the second specific example, the example in which controller 16 performs both the first-type abnormality diagnosing processing and the second-type abnormality diagnosing processing has been described. However, the first-type abnormality diagnosing processing may be performed by vehicle ECU 30. When the cooler or the water-cooling system, which is installed outside power supply system 10 and used in addition to the cooling of the cell, is used for cooling of the cell, vehicle ECU 30 controls the cooler or the water cooling system. In this case, vehicle ECU 30 and controller 16 of power supply system 10 cooperate to perform the failure diagnosis processing.

The exemplary embodiment may be specified by the following items.

Item 1

An abnormality diagnosing system including controller (16) that performs a plurality of pieces of abnormality diagnosing processing in a vehicle,
 wherein the plurality of pieces of abnormality diagnosing processing includes a first-type abnormality diagnosing processing of detecting an abnormality that occurs due to a plurality of types of causes and a second-type abnormality diagnosing processing of detecting an abnormality that occurs due to one type of cause, and
 when the abnormality is detected by the first-type abnormality diagnosing processing, controller (16) specifies the cause of the abnormality detected by the first-type abnormality diagnosing processing based on a diagnosis result of the second-type abnormality diagnosing processing.

Thus, the cause of the abnormality can correctly be identified.

Item 2

The abnormality diagnosing system described in item 1, wherein when the abnormality is detected by the first-type abnormality diagnosing processing, controller (16) performs the second-type abnormality diagnosing processing with the detection of the abnormality as a trigger. Thus, the cause of the abnormality can correctly be identified at an early stage.

Item 3

The abnormality diagnosing system described in item 2, wherein
 controller (16) performs the second-type abnormality diagnosing processing at predetermined time intervals, and
 when the abnormality is detected by the first-type abnormality diagnosing processing, controller (16) performs the second-type abnormality diagnosing processing with the detection of the abnormality as the trigger regardless of periodic performance timing of the second-type abnormality diagnosing processing.

Thus, when the first-type abnormality diagnosing processing and the second-type abnormality diagnosing processing are performed in parallel, the cause of the abnormality can correctly be identified at an early stage.

Item 4

The abnormality diagnosing system described in item 3, wherein controller (16) performs the first-type abnormality diagnosing processing continuously or in a period shorter than a period of the second-type abnormality diagnosing processing.

Thus, the cause of the abnormality can correctly be identified in the situation where the cause of the abnormality is easily identified by mistake.

Item 5

The abnormality diagnosing system described in one of items 1 to 4, wherein controller (16) performs different fail-safe processing according to the cause of the detected abnormality.

Thus, the optimal fail-safe processing that achieves both safety and convenience can be performed.

Item 6

Power supply system for vehicle (1) including:
a plurality of cells (E1 to En) connected in series;
voltage measurement unit (13) that is connected to each node between the plurality of cells (E1 to En) by a plurality of voltage measurement lines (L0 to L5), voltage measurement unit (13) measuring a voltage between adjacent voltage measurement lines to measure voltage at each cell (E1 to En); and
the abnormality diagnosing system described in one of items 1 to 5,
wherein the first-type abnormality diagnosing processing includes processing of detecting overvoltage or undervoltage of cell (E1 to En), and
the second-type abnormality diagnosing processing includes processing of detecting disconnection of voltage measurement line (L0 to L5).

Thus, the cause of the abnormality related to the voltages at the plurality of cells (E1 to En) can correctly be identified.

Item 7

Power supply system for vehicle (1) described in item 6, further including a plurality of switches (S1d to S5d) that connect the plurality of voltage measurement lines to predetermined fixed potentials,
wherein controller (16)
detects overvoltage or undervoltage of cell (E1 to En) based on voltage values of the plurality of cells (E1 to En) measured by voltage measurement unit (13), and
detects disconnection of the voltage measurement line (L0 to L5) based on a voltage value of the voltage measurement line (L0 to L5) when switch (S1d to S5d) connected to the voltage measurement line (L0 to L5) is turned on and when switch (S1d to S5d) is turned off after predetermined time elapses.

Thus, whether the disconnection of the voltage measurement line (L0 to L5) is the cause of the abnormality detected by the first-type abnormality diagnosing processing can correctly be detected.

REFERENCE MARKS IN THE DRAWINGS

1: electric vehicle
10: power supply system
11: power storage unit
12: management unit
13: voltage measurement unit
14: temperature measurement unit
15: current measurement unit
16: controller
17: heater
E1-En: cell
Rs: shunt resistor
T1-T3: temperature sensor
20: in-vehicle network
30: vehicle ECU
40: inverter
50: motor
60: instrument panel
RY1: relay
R0-R5: resistor
C1-C5: capacitor
L0-L5: voltage measurement line
S1d-S5d: discharge switch
R1d-R5d: discharge resistor

The invention claimed is:

1. An abnormality diagnosing system comprising
a controller that performs a plurality of pieces of abnormality diagnosing processing,
wherein the plurality of pieces of abnormality diagnosing processing includes
a first-type abnormality diagnosing processing of performing a first measurement, and detecting, based on a result of the first measurement, a first abnormality attributable to a plurality of types of causes and
a second-type abnormality diagnosing processing of performing a second measurement different from the first measurement, and detecting, based on a result of the second measurement, a second abnormality attributable only to one type of cause among the plurality of types of causes,
wherein the controller performs the second-type abnormality diagnosing processing at predetermined time intervals absent a detection of the first abnormality by the first-type abnormality diagnosing processing,
wherein when the first abnormality is detected by the first-type abnormality diagnosing processing, the controller determines a cause of the first abnormality based on a diagnosis result of the second-type abnormality diagnosing processing,
wherein the controller interrupts the first-type abnormality diagnosing processing while performing the second-type abnormality diagnosing processing in response to the detection of the first abnormality by the first-type abnormality diagnosing processing as a trigger regardless of the predetermined time intervals of the second-type abnormality diagnosing processing, and
wherein the controller selectively performs different fail-safe actions depending on whether the second abnormality is detected or not.

2. The abnormality diagnosing system according to claim 1, wherein the controller performs the first-type abnormality diagnosing processing continuously or at time intervals shorter than the predetermined time intervals of the second-type abnormality diagnosing processing.

3. The abnormality diagnosing system according to claim 1, wherein the controller performs different fail-safe processing according to the cause of the first abnormality determined by the controller.

4. A power supply system comprising:
a plurality of cells connected in series;
a voltage measurement unit that is connected to each node between the plurality of cells by a plurality of voltage measurement lines, the voltage measurement unit measuring a voltage between adjacent voltage measurement lines to measure voltage at each of the plurality of cells; and
the abnormality diagnosing system according to claim 1,
wherein the first-type abnormality diagnosing processing includes detecting overvoltage or undervoltage of each of the plurality of cells, and the second-type abnormality diagnosing processing includes detecting disconnection of the voltage measurement lines.

5. The power supply system according to claim 4, further comprising a plurality of switches that connect the plurality of voltage measurement lines respectively to predetermined fixed potentials, wherein the controller detects overvoltage or undervoltage of each of the plurality of cells based on voltage values of the plurality of cells measured by the voltage measurement unit, and detects disconnection of a voltage measurement line among the voltage measurement lines based on a voltage value of the voltage measurement line when a switch among the plurality of switches connected to the voltage measurement line is turned on and when the switch is turned off after predetermined time elapses.

6. The abnormality diagnosing system according to claim 1, wherein the controller performs:

a first fail-safe action where the first abnormality is detected, and a second fail-safe action, different from the first fail-safe action, only where the second abnormality is detected.

* * * * *